(12) United States Patent
Ida et al.

(10) Patent No.: US 10,854,419 B2
(45) Date of Patent: Dec. 1, 2020

(54) CONTOUR EXTRACTION METHOD, CONTOUR EXTRACTION DEVICE, AND NON-VOLATILE RECORDING MEDIUM

(71) Applicant: TOSHIBA MEMORY CORPORATION, Minato-ku (JP)

(72) Inventors: Chihiro Ida, Yokkaichi (JP); Yukinobu Sakata, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 88 days.

(21) Appl. No.: 16/287,060

(22) Filed: Feb. 27, 2019

(65) Prior Publication Data

US 2020/0083019 A1 Mar. 12, 2020

(30) Foreign Application Priority Data

Sep. 7, 2018 (JP) .................. 2018-167650

(51) Int. Cl.
*H01J 37/26* (2006.01)
*H01J 37/22* (2006.01)

(52) U.S. Cl.
CPC .......... *H01J 37/261* (2013.01); *H01J 37/222* (2013.01); *H01J 2237/24475* (2013.01)

(58) Field of Classification Search
CPC ................... H01J 37/261; H01J 37/222; H01J 2237/24475
See application file for complete search history.

(56) References Cited

U.S. PATENT DOCUMENTS

| 7,889,908 B2 | 2/2011 | Miyamoto et al. |
| 8,653,456 B2 | 2/2014 | Toyoda et al. |
| 8,890,068 B2 | 11/2014 | Kasai et al. |
| 2009/0032710 A1* | 2/2009 | Ozawa .................. H01J 37/222 250/311 |
| 2012/0305767 A1* | 12/2012 | Toyoda ................. H01J 37/244 250/310 |

FOREIGN PATENT DOCUMENTS

| CN | 107292857 A | 10/2017 |
| JP | 4262690 | 5/2009 |
| JP | 2011-165479 | 8/2011 |
| JP | 5584159 | 9/2014 |
| JP | 6281019 | 2/2018 |
| TW | 2015/06388 A | 2/2015 |

* cited by examiner

*Primary Examiner* — Ruiping Li
(74) *Attorney, Agent, or Firm* — Oblon, McClelland, Maier & Neustadt, L.L.P.

(57) ABSTRACT

According to one embodiment, a contour extraction method for extracting a contour of a target object from an image obtained using an electron beam includes: extracting the contour of the target object from a backscattered electron image; creating a dictionary for associating a secondary electron image obtained from a portion common to the backscattered electron image with the contour; calculating a likelihood of the contour of the target object in a plurality of positions of a newly obtained secondary electron image by referencing the dictionary regarding the newly obtained secondary electron image; and setting a route along which a total sum of the likelihood is maximized out of the plurality of positions as the contour of the target object.

20 Claims, 10 Drawing Sheets

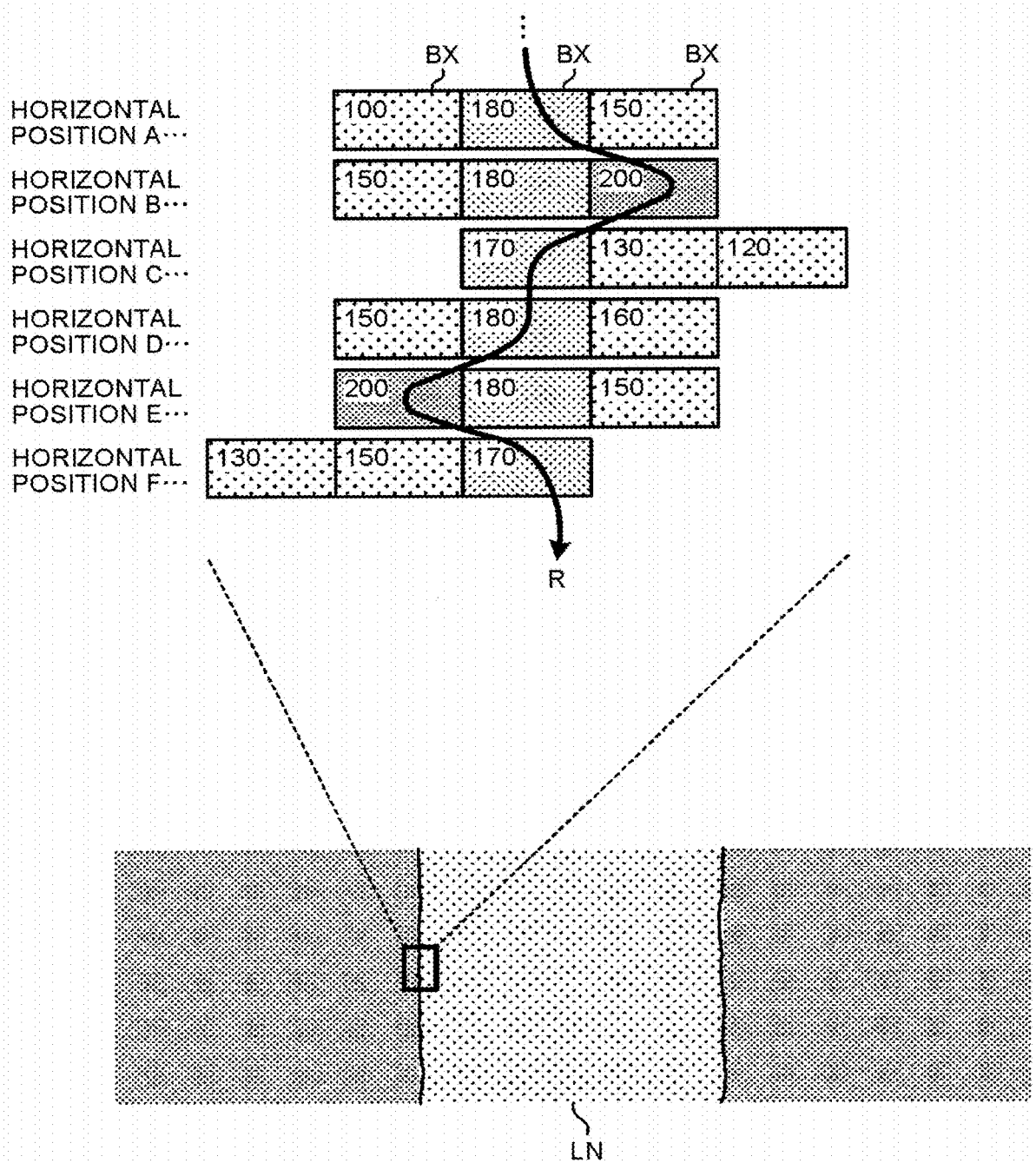

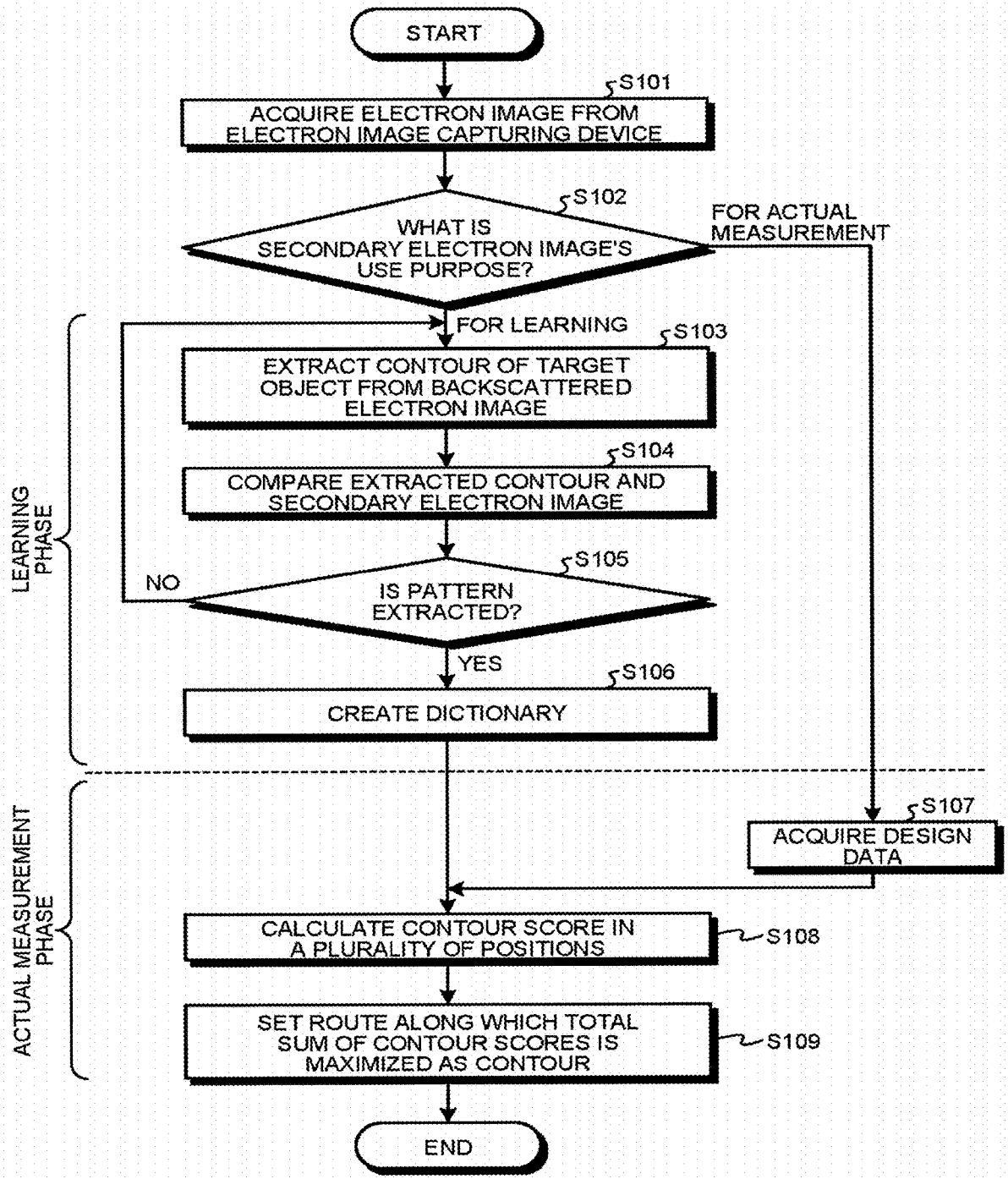

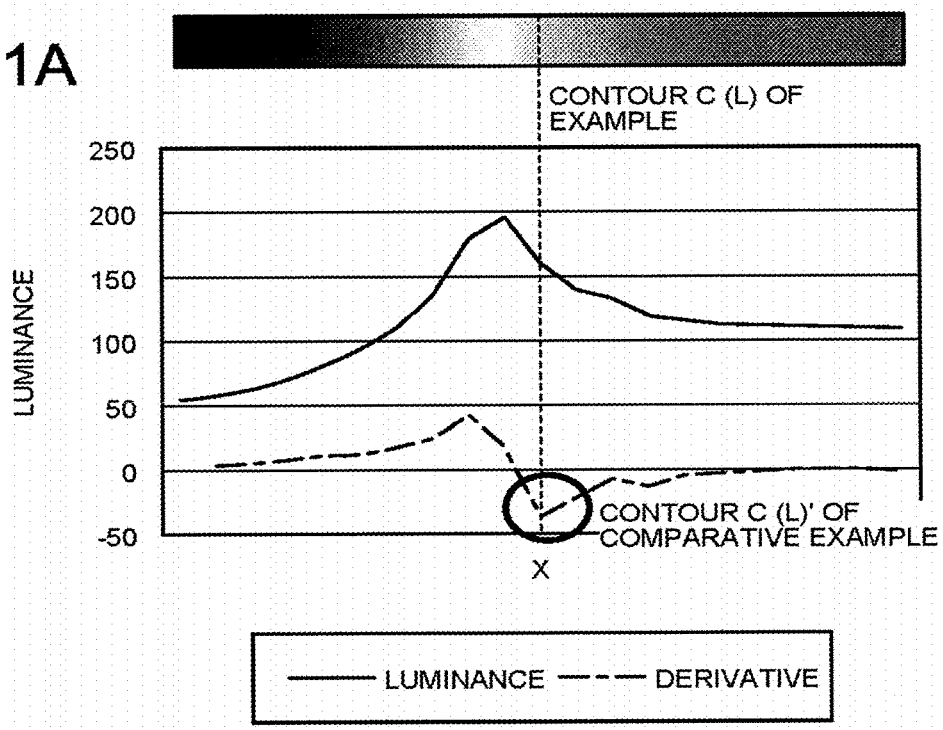
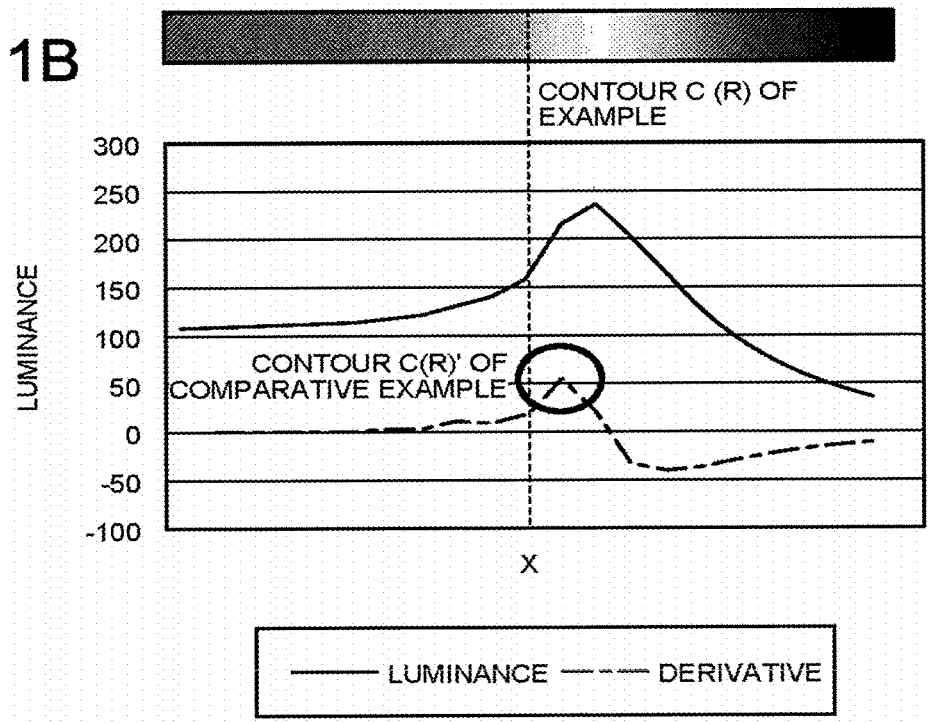

FIG.12

|  | LEFT END | RIGHT END |
|---|---|---|
| EXAMPLE | 0.45(±0.13) | 0.41(±0.09) |
| COMPARATIVE EXAMPLE | 0.47(±0.11) | 0.54(±0.15) |

CONTOUR EXTRACTION METHOD, CONTOUR EXTRACTION DEVICE, AND NON-VOLATILE RECORDING MEDIUM

CROSS-REFERENCE TO RELATED APPLICATIONS

This application is based upon and claims the benefit of priority from Japanese Patent Application No. 2018-167650, filed on Sep. 7, 2018; the entire contents of which are incorporated herein by reference.

FIELD

Embodiments described herein relate generally to a contour extraction method, a contour extraction device, and a non-volatile recording medium.

BACKGROUND

A technique of extracting a contour of a target object from an image obtained by using an electron beam is known in the art.

BRIEF DESCRIPTION OF THE DRAWINGS

FIG. 8 is a diagram illustrating a route determination method in the contour extraction device according to the embodiment;

FIG. 10 is a flowchart illustrating an exemplary sequence of a contour extraction processing using the contour extraction device according to the embodiment;

FIG. 11A is a graph illustrating positions of contours extracted in an example and a comparative example;

FIG. 11B is a graph illustrating positions of contours extracted in the example and the comparative example; and FIG. 12 is a diagram illustrating position accuracy of contours extracted in the example and the comparative example.

DETAILED DESCRIPTION

According to an embodiment, a contour extraction method for extracting a contour of a target object from an image obtained using an electron beam includes: extracting the contour of the target object from a backscattered electron image; creating a dictionary for associating a secondary electron image obtained from a portion common to the backscattered electron image with the contour; calculating a likelihood of the contour of the target object in a plurality of positions of a newly obtained secondary electron image by referencing the dictionary regarding the newly obtained secondary electron image; and setting a route along which a total sum of the likelihood is maximized out of the plurality of positions as the contour of the target object.

The present invention will now be described in details with reference to the accompanying drawings. Note that the following embodiments are not intended to limit the present invention. In addition, elements of the following embodiments include those readily anticipatable by a person ordinarily skilled in the art or substantially equivalent thereto.

Embodiment

An embodiment will be described with reference to FIGS. 1 to 10.

(Exemplary Configuration of Contour Extraction Device)

Figure 1:
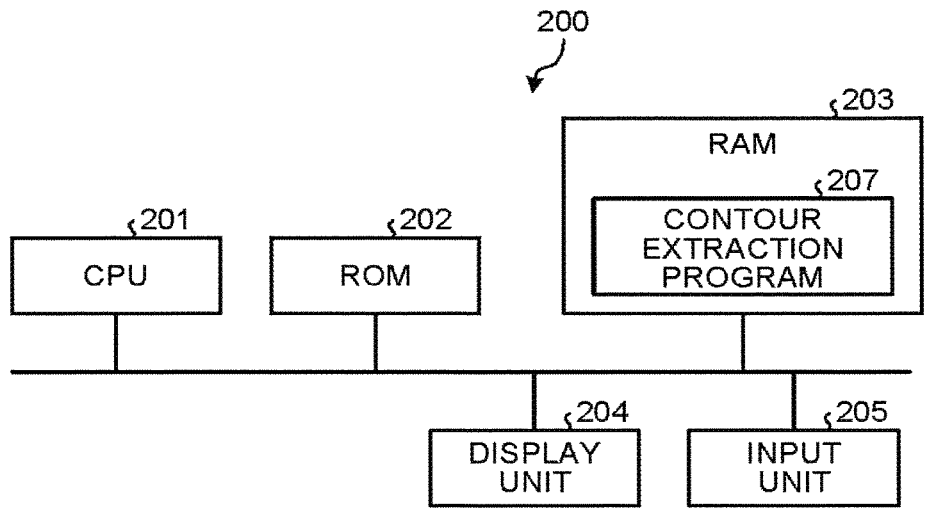
FIG. 1 is a block diagram illustrating an exemplary hardware configuration of a contour extraction device according to an embodiment.

FIG. 1 is a block diagram illustrating an exemplary hardware configuration of a contour extraction device 200 according to an embodiment.

As illustrated in FIG. 1, the contour extraction device 200 has a central processing unit (CPU) 201, a read only memory (ROM) 202, a random access memory (RAM) 203, a display unit 204, and an input unit 205. In the contour extraction device 200, the CPU 201, the ROM 202, the RAM 203, the display unit 204, and the input unit 205 are connected to each other via a bus line.

The CPU 201 extracts a contour of a target object using a contour extraction program 207 as a computer program. The contour extraction program 207 is a computer-executable computer program product having a computer-readable recording medium containing a plurality of commands for extracting a contour. In the contour extraction program 207, the plurality of commands cause a computer to execute a contour extraction processing.

The display unit 204 is a display device such as a liquid crystal display monitor and displays a contour of a target object or the like on the basis of an instruction from the CPU 201. The input unit 205 includes a mouse and/or a keyboard to receive an input of instruction information (such as a parameter necessary for extracting a contour) externally input from a user. The instruction information input to the input unit 205 is transmitted to the CPU 201.

The contour extraction program 207 is stored in the ROM 202 and is loaded on the RAM 203 via a bus line. FIG. 1 illustrates a state in which the contour extraction program 207 is loaded on the RAM 203.

The CPU 201 executes the contour extraction program 207 loaded on the RAM 203. Specifically, the contour extraction device 200 causes the CPU 201 to read the contour extraction program 207 from the ROM 202 in response to an instruction input from a user using the input unit 205 and deploy it in a program storage area of the RAM 203 to execute various types of processing. The CPU 201 temporarily stores various pieces of data created in such various types of processing in a data storage area formed in the RAM 203.

The contour extraction program 207 executed by the contour extraction device 200 has a modular configuration containing a learning phase module and an actual measurement phase module described below, that are loaded and created on a main memory unit.

Figure 2:
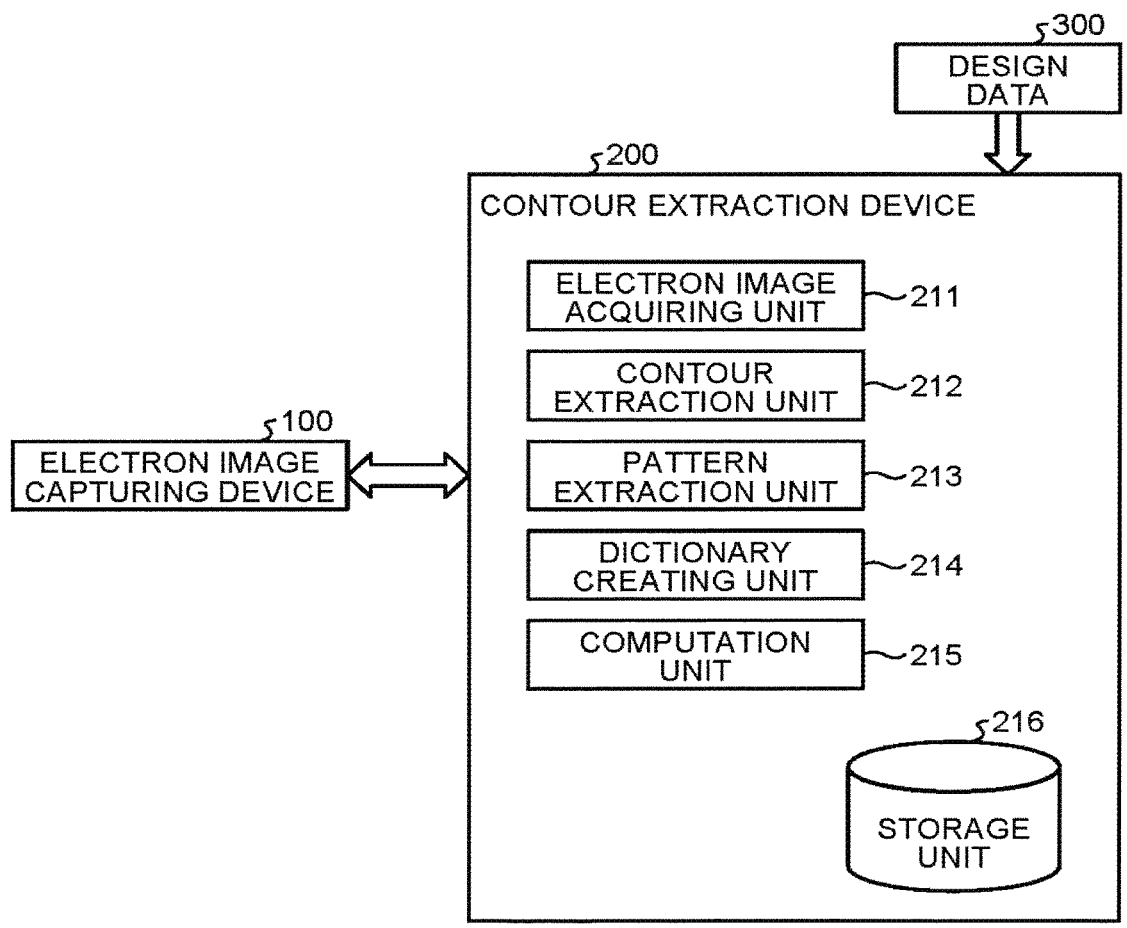
FIG. 2 is a block diagram illustrating an exemplary software configuration of the contour extraction device according to the embodiment.

FIG. 2 is a block diagram illustrating an exemplary software configuration of the contour extraction device 200 according to the embodiment.

As illustrated in FIG. 2, an electron image capturing device 100 is communicatively connected to the contour extraction device 200. The contour extraction device 200 transmits/receives an electron image of a target object, a capturing condition of the electron image, or the like to/from the electron image capturing device 100.

The contour extraction device 200 is also configured to receive design data 300. The design data 300 contains information regarding the contour of the target object such as whether the contour of the target object is straight or curved.

The contour extraction device 200 includes an electron image acquiring unit 211, a contour extraction unit 212, a pattern extraction unit 213, a dictionary creating unit 214, a computation unit 215, and a storage unit 216 in order to implement functions of the contour extraction device 200. Such a configuration may be implemented by causing the CPU 201 to execute a program or may be implemented as a dedicated hardware circuit. In addition, the storage unit 216 may be implemented by HDD or the like.

The electron image acquiring unit 211 acquires an electron image of the target object from the electron image capturing device 100. The electron image of the target object includes a backscattered electron image obtained by detecting backscattered electrons and a secondary electron image obtained by detecting secondary electrons. The backscattered electron image is used in learning and pattern extraction of the pattern extraction unit 213. The secondary electron image is used for learning or actual measurement.

The contour extraction unit 212 extracts a contour of the target object from the backscattered electron image acquired by the electron image acquiring unit 211. The contour of the target object is extracted using an image recognition technique or the like.

The pattern extraction unit 213 performs iterative learning in which the secondary electron image for learning obtained from a portion common to the backscattered electron image is compared with the contour extracted from the backscattered electron image. Such learning is performed, for example, using machine learning. As a result, the pattern extraction unit 213 extracts a pattern representing a relationship between the contour extracted from the backscattered electron image and the secondary electron image.

The dictionary creating unit 214 creates a dictionary for associating the secondary electron image with the contour extracted from the backscattered electron image obtained from a portion common to the secondary electron image on the basis of the pattern extracted by the pattern extraction unit 213.

The computation unit 215 extracts a contour of the target object from the secondary electron image for actual measurement by referencing the dictionary created by the dictionary creating unit 214.

The storage unit 216 stores various electron image data acquired by the electron image acquiring unit 211, the design data 300, the contour data extracted from the backscattered electron image, the pattern data extracted by the pattern extraction unit 213, the dictionary data created by the dictionary creating unit 214, the contour data extracted by the computation unit 215, and the like.

(Backscattered Electron Image and Secondary Electron Image)

Figure 3:
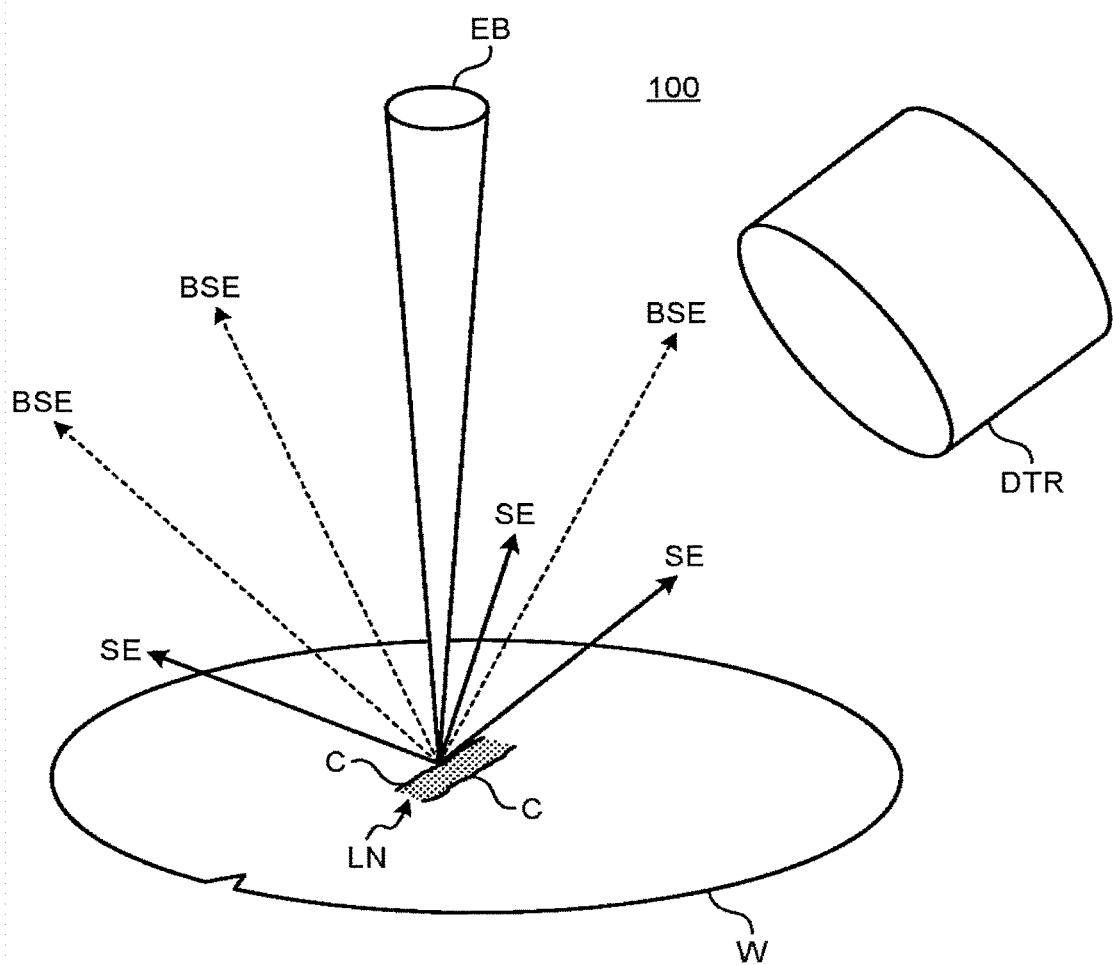
FIG. 3 is a schematic diagram illustrating a backscattered electron image and a secondary electron image used by the contour extraction device according to the embodiment.

Here, the backscattered electron image and the secondary electron image used by the contour extraction device 200 according to the embodiment will be described with reference to FIG. 3. FIG. 3 is a schematic diagram illustrating the backscattered electron image and the secondary electron image used by the contour extraction device 200 according to the embodiment.

As illustrated in FIG. 3, the target object for contour extraction could be a structure on a wafer W such as a semiconductor substrate. In FIG. 3, an example will be described, in which a contour C of a metal line LN buried in a trench of an insulation layer (not illustrated) formed on a wafer W is extracted. The metal line LN may be, for example, a part of a semiconductor device formed on the wafer W.

The electron image such as the backscattered electron image and the secondary electron image is captured using the electron image capturing device 100 such as a critical dimension scanning electron microscope (CD-SEM) or a defect review scanning electron microscope (DR-SEM).

Specifically, an electron beam EB is irradiated from an electron gun provided in the electron image capturing device 100 toward the wafer W as a target object. At this time, secondary electrons SE are emitted from the surface as electrons collide with the surface of the wafer W. In addition, a part of electrons incident to the wafer W, scattered in the wafer W, and emitted again to the outside of the wafer W refer to backscattered electrons BSE. In the electron image capturing device 100, a detector DTR detects such secondary electrons and backscattered electrons, or the like, to obtain respective electron images.

(Learning Method of Contour Extraction Device)

Figure 4:
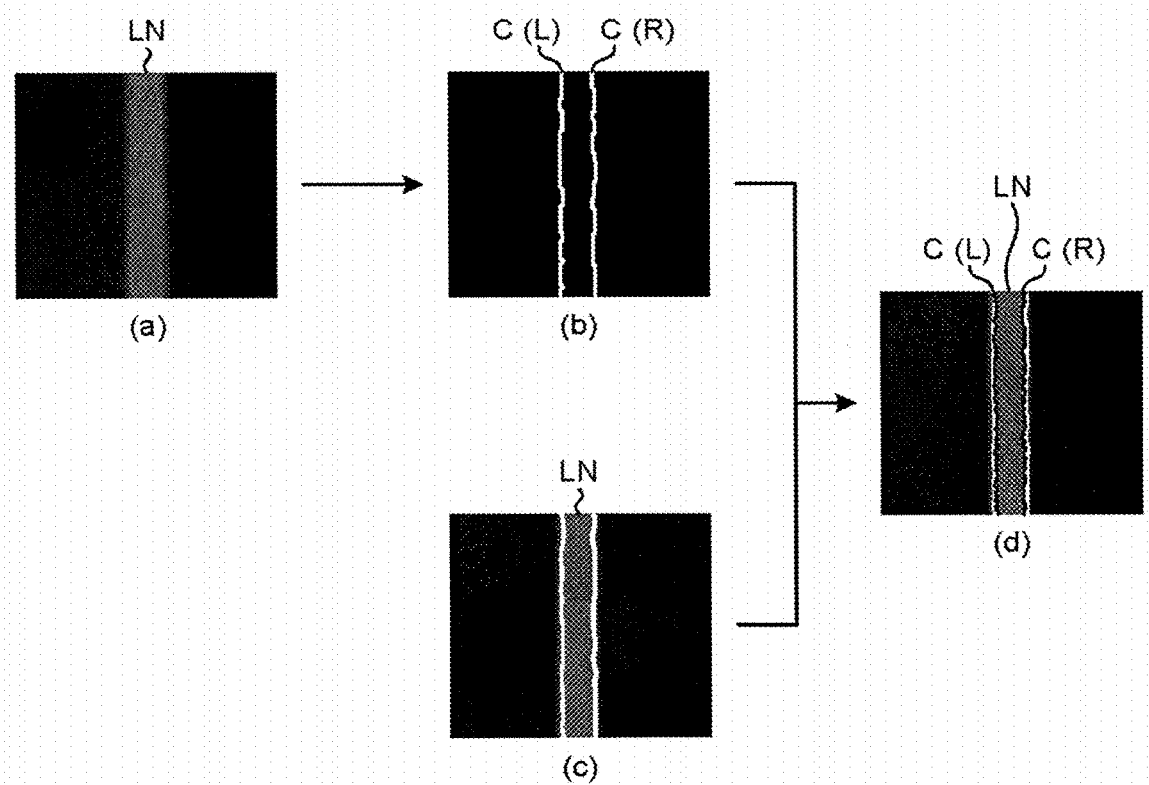
FIG. 4 is a diagram illustrating a method of associating a secondary electron image and a contour using the contour extraction device according to the embodiment.

Next, a learning method of the contour extraction device 200 will be described with reference to FIGS. 4 and 5. FIG. 4 is a diagram illustrating a method of associating the secondary electron image and the contour using the contour extraction device 200 according to the embodiment.

FIG. 4(a) is a backscattered electron image acquired from the electron image capturing device 100 using the electron image acquiring unit 211. Similar to FIG. 3, here, for example, it is assumed that a backscattered electron image of a metal line LN buried in a trench of an insulation layer on a wafer is obtained. The backscattered electron image of the metal line LN becomes an overview image of the metal line LN as seen from the top.

As illustrated in FIG. 4(b), the contour extraction unit 212 extracts contours C(L) and C(R) of the metal line LN from the backscattered electron image. The contour C(L) is a contour of a left end of a width direction of the metal line LN. The contour C(R) is a contour of a right end of the width direction of the metal line LN. The contours C(L) and C(R) can be extracted by setting a position where a contrast between brightness and darkness is most remarkably changed in the backscattered electron image as the positions of the contours C(L) and C(R) using an image recognition technique or the like.

FIG. 4(c) illustrates a secondary electron image acquired from the electron image capturing device 100 using the electron image acquiring unit 211. The secondary electron image of FIG. 4(c) is acquired on the metal line LN in a portion common to the backscattered electron image of FIG. 4(a) and is used in learning of the contour extraction device 200.

Through FIGS. 4(b) and 4(c), as illustrated in FIG. 4(d), a single piece of the associated data in which the contours C(L) and C(R) and the secondary electron image in the common portion are associated is obtained. The pattern extraction unit 213 repeatedly performs learning for comparing the contours C(L) and C(R) and the secondary electron image in the common portion using a plurality of pieces of the associated data. At this time, for example, quantitative and statistical comparison can be performed by extracting a quantitative value such as luminance or a first derivative of the luminance from the secondary electron image and taking a statistical amount of this value. Such learning may be performed, for example, using machine learning. As a result, the pattern extraction unit 213 patternizes and extracts a relationship between the contours C(L) and C(R) and the secondary electron image through learning.

Figure 5:
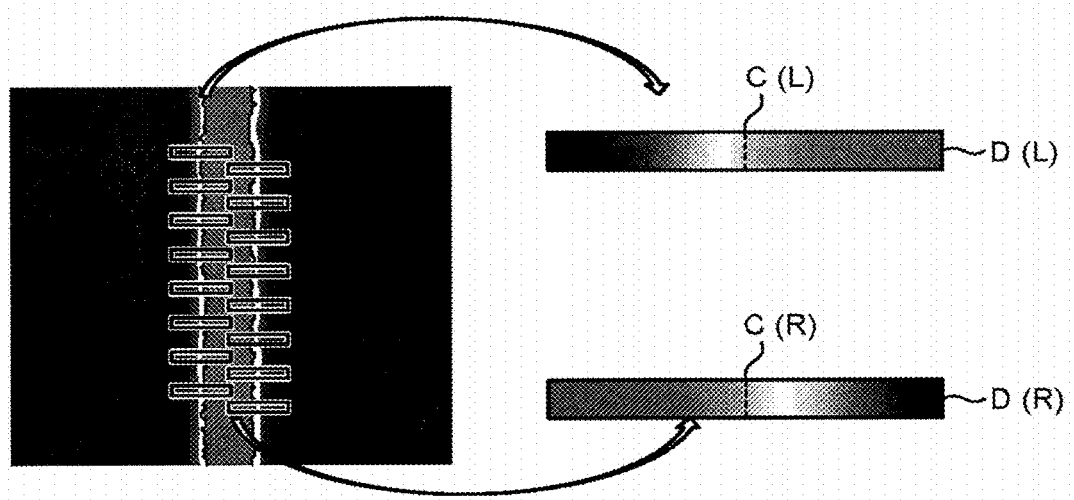
FIG. 5 is a diagram illustrating an exemplary dictionary obtained through learning of the contour extraction device according to the embodiment.

FIG. 5 is a diagram illustrating an exemplary dictionary obtained through learning of the contour extraction device 200 according to the embodiment.

As illustrated in FIG. 5, the dictionary creating unit 214 creates dictionaries D(L) and D(R), in which the contours C(L) and C(R) and the secondary electron image in the common portion are associated, on the basis of the pattern extracted by the pattern extraction unit 213. The dictionary D(L) is a dictionary for the contour C(L) in the left end of the width direction of the metal line LN. The dictionary D(R) is a dictionary for the contour C(R) in the right end of the width direction of the metal line LN.

The dictionary D(L) has patternized image data of the secondary electron image obtained by extracting the vicinity of the contour C(L) in a slit shape. In the image data, the contour C(L) extending perpendicularly to the slit is arranged in the center of the image extracted in the slit shape.

The dictionary D(R) has patternized image data of the secondary electron image obtained by extracting the vicinity of the contour C(R) in a slit shape. In the image data, the contour C(R) extending perpendicularly to the slit is arranged in the center of the image extracted in the slit shape.

The dictionaries D(L) and D(R) created in this manner are referenced when the contours C(L) and C(R) are extracted from the newly acquired secondary electron image for actual measurement.

(Contour Extraction Method of Contour Extraction Device)

Figure 6:
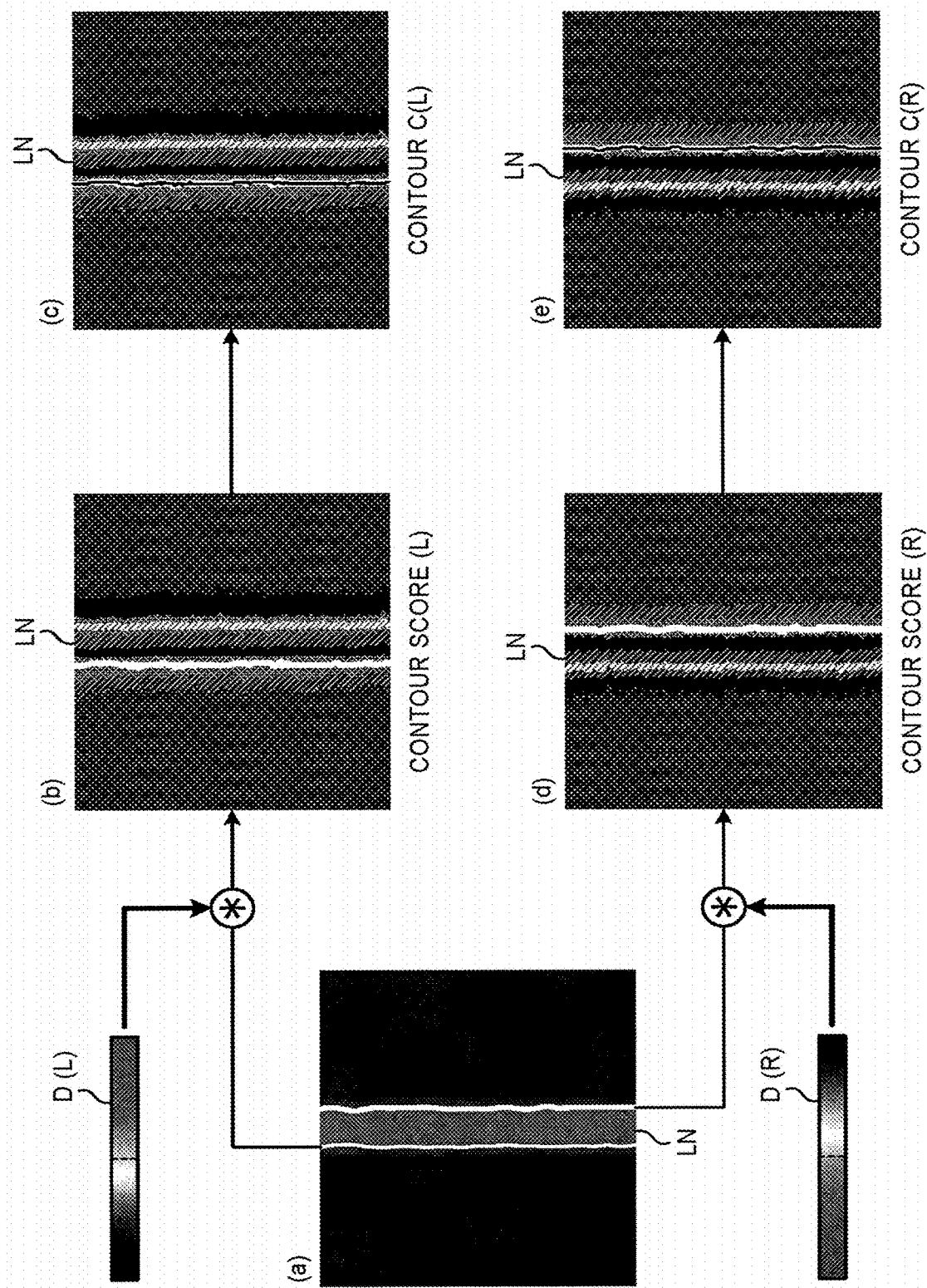
FIG. 6 is a diagram illustrating an outline of a contour extraction method in the contour extraction device according to the embodiment.

Next, a contour extraction method in the contour extraction device 200 will be described with reference to FIGS. 6 to 9B. FIG. 6 is a diagram illustrating an outline of the contour extraction method in the contour extraction device 200 according to the embodiment.

FIG. 6(a) is a secondary electron image acquired from the electron image capturing device 100 using the electron image acquiring unit 211. The secondary electron image of FIG. 6(a) is used for actual measurement of contour extraction. At this time, the secondary electron image for actual measurement is preferably captured by setting a condition of the electron image capturing device 100 to the same condition as the condition of the secondary electron image for learning.

As illustrated in FIG. 6(b), the computation unit 215 calculates a contour score (L) for a plurality of positions on the secondary electron image of FIG. 6(a) by referencing the dictionary D(L). The contour score (L) is a numerical value representing how much a position on the secondary electron image is likely to correspond to the contour of the left end of the width direction of the metal line LN, that is, a likelihood. As the contour score (L) increases, the position is more likely to correspond to the contour C(L) of the metal line LN.

As illustrated in FIG. 6(c), the computation unit 215 calculates a route along which a total sum of the contour scores (L) calculated for a plurality of positions is maximized and sets this route as the contour C(L).

As illustrated in FIG. 6(d), the computation unit 215 calculates the contour score (R) for the plurality of positions on the secondary electron image of FIG. 6(a) by referencing the dictionary D(R). The contour score (R) is a numerical value representing how much a position on the secondary electron image is likely to correspond to the contour of the right end of the width direction of the metal line LN, that is, a likelihood. As the contour score (R) increases, the position is more likely to correspond to the contour C(R) of the metal line LN.

As illustrated in FIG. 6(e), the computation unit 215 calculates a route along which a total sum of the contour scores (R) calculated for a plurality of positions is maximized and sets this route as the contour C(R).

A contour score calculation method will be described in more details with reference to FIG. 7.

Figure 7:
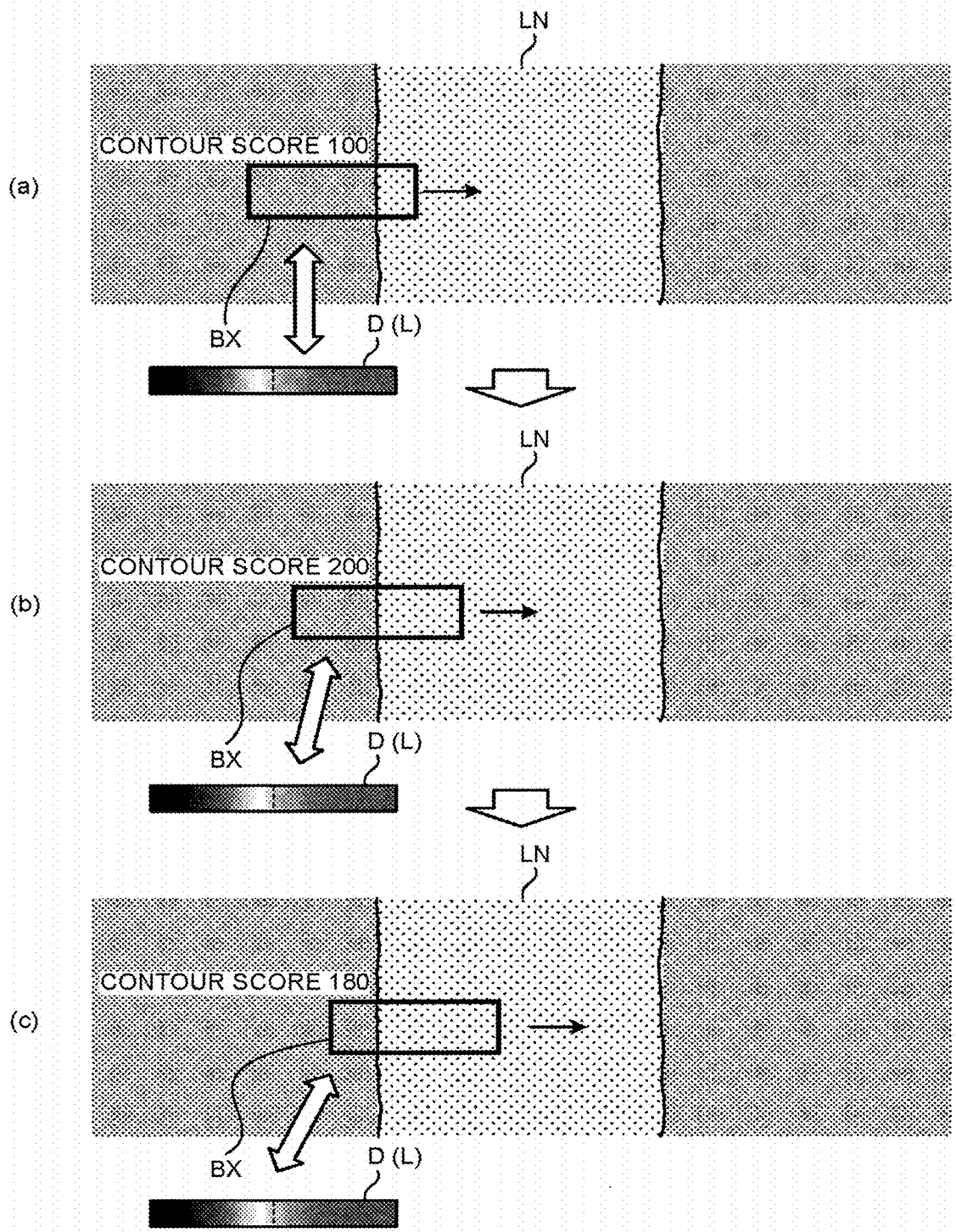
FIG. 7 is a diagram illustrating a contour score calculation method in the contour extraction device according to the embodiment.

FIG. 7 is a diagram illustrating the contour score calculation method in the contour extraction device 200 according to the embodiment. FIG. 7 illustrates an example of calculating the contour score (L) for the left end of the width direction of the metal line LN in the secondary electron image.

As illustrated in FIG. 7, the computation unit 215 sets a slit-shaped box BX for extracting a part of the secondary electron image on the secondary electron image. This box BX has, for example, the same shape and size as those of the slit of the created dictionary D(L). In addition, the slit-shaped box BX is set to extend perpendicularly to an extending direction of the assumed contour C(L). The extending direction of the contour C(L) can be estimated from the design data 300 of the metal line LN received by the contour extraction device 200. In this example, the contour C(L) is set to extend substantially in a vertical direction on the secondary electron image, and the box BX is set to extend in a horizontal direction.

As illustrated in FIG. 7(a), the computation unit 215 compares the secondary electron image extracted by the box BX and the dictionary D(L) to calculate the contour score (L) in this position. As similarity between the secondary electron image extracted by the box BX and the pattern of the dictionary D(L) increases, a correlation therebetween increases, and the numerical value of the contour score (L) is calculated as a greater value. In the example of FIG. 7(a), the contour C(L) of the metal line LN is positioned in the right end of the box BX, and the correlation between the extracted secondary electron image and the pattern of the dictionary D(L) is not so high. The contour score (L) of this position is calculated as, for example, "100".

As illustrated in FIG. 7(b), the computation unit 215 shifts the position of the box BX, for example, by one pixel in the extending direction of the box, that is, in the horizontal direction, and calculates the contour score (L) there. In the example of FIG. 7(b), the contour C(L) of the metal line LN is positioned substantially in the center of the box BX, and the correlation between the extracted secondary electron image and the pattern of the dictionary D(L) is quite high. The contour score (L) at this position is calculated as, for example, "200".

As illustrated in FIG. 7(c), the computation unit 215 further shifts the position of the box BX in the horizontal direction by one pixel, and calculates the contour score (L) there. In the example of FIG. 7(c), the contour C(L) of the metal line LN is positioned slightly in the left side of the box BX, and the correlation between the extracted secondary electron image and the pattern of the dictionary D(L) is slightly high. The contour score (L) at this position is calculated as, for example, "180".

In this manner, the computation unit 215 sequentially shifts the position of the box BX by one pixel in the horizontal direction and calculates the contour scores (L) there. That is, the computation unit 215 sequentially calculates the contour scores (L), for example, from the left end to the right end of the secondary electron image in a predetermined horizontal position. This is repeated, for example, for the horizontal positions from the upper end to the lower end of the secondary electron image.

Determination of the route based on the contour score will be described with reference to FIG. 8.

FIG. 8 is a diagram illustrating a route determination method in the contour extraction device 200 according to the embodiment. FIG. 8 illustrates a part of the box BX having the contour score calculated by the computation unit 215 in a plurality of horizontal positions A to F of the secondary electron image. Each rectangle of FIG. 8 represents the box BX. The numerical value inside the box BX refers to the contour score of the corresponding box BX.

As illustrated in FIG. 8, the computation unit 215 determines a route R from the top to the bottom of the secondary electron image by selecting a predetermined box BX in each of horizontal positions A to F.

For example, the computation unit 215 selects the center box BX having the highest contour score (180) in the horizontal position A.

The computation unit 215 can select the next box BX in the horizontal position B out of the box BX immediately under the box BX selected in the horizontal position A and the left and right boxes BX thereof. The computation unit 215 selects the right box BX having the highest contour score (200) out of the three boxes BX in the horizontal position B.

The computation unit 215 selects the left box BX having the highest contour score (170) in the horizontal position C out of the box BX immediately under the box BX selected in the horizontal position B and the left and right boxes BX thereof.

Similarly, the computation unit 215 selects the center box BX (contour score: 180) out of the three boxes BX selectable in the horizontal position D, selects the left box BX (contour score: 200) out of the three boxes PX selectable in the horizontal position E, and selects the right box BX (contour score: 170) out of the three boxes BX selectable in the horizontal position F.

The computation unit 215 determines the route R by connecting the boxes BX selected as described above at respective horizontal positions A to F. This route R is a route along which a total sum of the contour scores is maximized out of the routes passing through the boxes BX selectable in respective horizontal positions A to F. The computation unit 215 determines this route R as a contour.

While a case where the extracted contour has a substantially straight shape has been described hereinbefore, a similar method can be employed even for a case where the contour has a curved shape. In the following description, some of the examples in which the contour does not have a straight shape will be described.

Figure 9A:
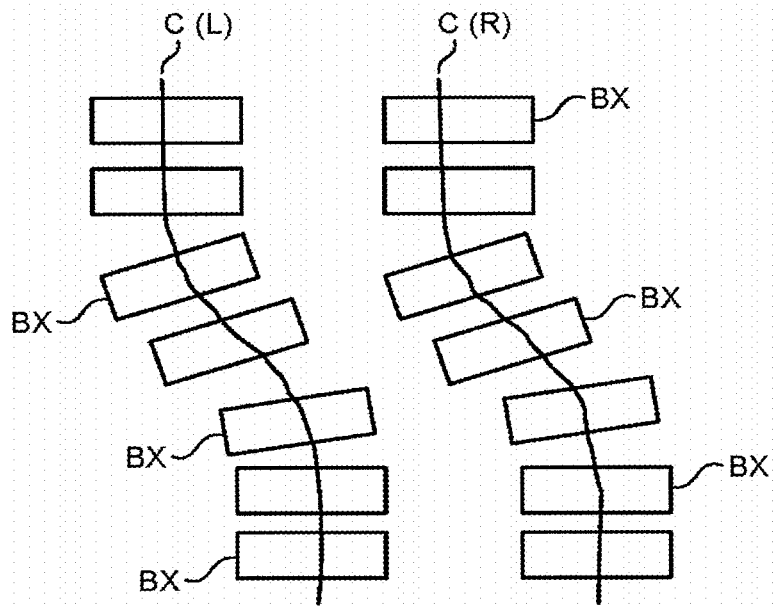
FIG. 9A is a diagram illustrating a box setting method in the contour extraction device according to the embodiment.
Figure 9B:
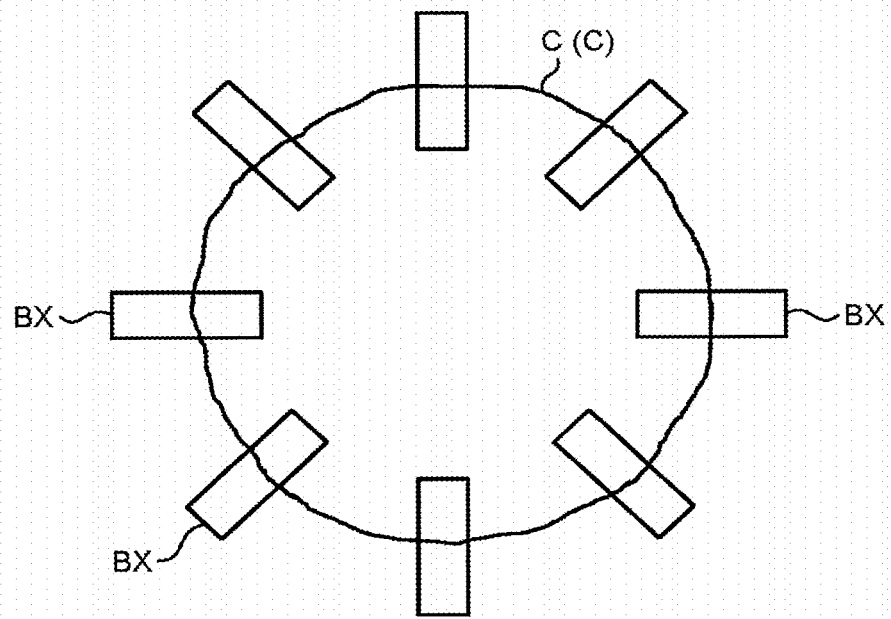
FIG. 9B is a diagram illustrating the box setting method in the contour extraction device according to the embodiment.

FIGS. 9A and 9B are diagrams illustrating a method of setting the box BX in the contour extraction device 200 according to the embodiment. In order to set the box BX, the computation unit 215 predicts a contour having a predetermined target object from the design data 300. The design data 300 contains design information such as wirings or contacts formed on the wafer. The computation unit 215 sets arrangement of the boxes BX so as to extend perpendicularly to the extending direction of the contour on the basis of the predicted contour of the target object.

The contours C(L) and C(R) of FIG. 9A partially have curved portions. In this case, the computation unit 215 sets the boxes BX of the straight portions of the contours C(L) and C(R) to be horizontal. In addition, the computation unit 215 sets arrangement of each box BX in the curved portions of the contours C(L) and C(R) so as to tilt the boxes BX along the curves of the contours C(L) and C(R) and extend perpendicularly to the curved contours C(L) and C(R).

The contour C(C) of FIG. 9B has a circular shape (circle). In this case, the computation unit 215 sets arrangement of each box BX so as to tilt the boxes BX along the curve of each part of the contour C(C) and extend perpendicularly to the circular contour C(C). As a result, each box BX is arranged radially.

Similar to the aforementioned method, subsequent calculation of the contour score, determination of the route based on the contour score, and extraction of the contour are performed by the computation unit 215. A shape of the contour of the metal line, contact, or the like extracted in this manner, such as a line width, a contact diameter, and smoothness of the contour, is then evaluated and utilized in the next processing.

Note that, while an example in which the design data 300 is used as data representing the contour of the target object in order to estimate the contour of the target object has been described, the embodiment is not limited thereto. For example, data regarding the contour extracted from a plurality of backscattered electron images may be used as the data representing the contour of the target object. The computation unit 215 can predict the contour of the target object from the shape of the contour extracted from the plurality of the backscattered electron images.

In addition, the design data 300 for predicting the contour may be referenced by the pattern extraction unit 213 and the dictionary creating unit 214 when the secondary electron image is extracted in a slit shape.

In addition, although the embodiment is applied to the metal line buried in the insulation layer in the aforementioned description by way of example, the method using the contour extraction device 200 can also be applied to a target object having a hollow and a protrusion such as a contour of a groove or a hole as well as a target object having a flat surface. In addition, it is possible to extract contours of various target objects as well as a semiconductor device formed on a wafer.

(Exemplary Contour Extraction Processing)

Next, an exemplary contour extraction processing using the contour extraction device 200 will be described with reference to FIG. 10. FIG. 10 is a flowchart illustrating an exemplary sequence of the contour extraction processing using the contour extraction device 200 according to the embodiment.

As illustrated in FIG. 10, the contour extraction processing using the contour extraction device 200 includes a learning phase (steps S103 to S106) and an actual measurement phase (steps S107 to S109). The learning phase is a processing until the dictionary is created by acquiring an electron image, and is executed by the learning phase module in the contour extraction program 207 described above. The actual measurement phase is a processing for extracting a contour from a secondary electron image in practice for actual measurement, and is executed by an actual measurement phase module in the contour extraction program 207 described above.

The electron image acquiring unit 211 acquires a backscattered electron image, a secondary electron image, or the like from the electron image capturing device 100 (step S101). For the secondary electron image, the processing is different depending on its use purpose (step S102). If the acquired secondary electron image is for actual measurement, the process advances to step S107.

If the acquired secondary electron image is for learning, the contour extraction unit 212 extracts a contour of the target object such as a metal line on a wafer from the backscattered electron image captured in a portion common to the secondary electron image (step S103). The pattern extraction unit 213 compares the extracted contour and the secondary electron image (step S104).

The processing of steps S103 to S105 is repeated until the pattern extraction unit 213 patternizes and extracts a relationship between the contour and the secondary electron image through iterative learning (step S105: No→step S103→step S104).

If the pattern extraction unit 213 extracts the pattern (step S105: Yes), the dictionary creating unit 214 creates a dictionary for associating the contour and the secondary electron image on the basis of the extracted pattern (step S106).

If the acquired secondary electron image is for actual measurement, the contour extraction device 200 acquires design data of the target object that obtains the secondary electron image (S107). The computation unit 215 sets a suitable box on the basis of the contour predicted from the design data and calculates the contour scores in a plurality of positions on the secondary electron image by referencing the created dictionary (step S108).

The computation unit 215 determines a route along which a total sum of the contour scores is maximized out of a plurality of positions for which the contour scores are calculated, and determines this route as a contour of the target object (step S109).

As a result, the contour extraction processing using the contour extraction device 200 is terminated.

Comparative Example

An electron image obtained using an electron beam is used to extract a contour of the target object and perform configuration evaluation in some cases. It is conceived that a backscattered electron image or a secondary electron image may be used in a contour extraction method of a comparative example.

The backscattered electron is less affected by electric charging on a surface of the target object, and is used to easily obtain an electron image close to a real image. In addition, a contour can be observed with a clear contrast at a boundary between the insulation layer and the metal layer formed of different materials. Meanwhile, the backscattered electron is inferior in reproducibility because it has a small signal amount and a low S/N ratio.

The secondary electron has an abundant signal amount and a high S/N ratio, so that an electron image can be obtained with excellent reproducibility. Meanwhile, the secondary electron is susceptible to influence of charging, and the obtained electron image is deviated from the real image in some cases. For this reason, the contour of the target object becomes blurred, or it is difficult to extract a contour with high accuracy in some cases.

The contour extraction device 200 according to the embodiment creates a dictionary for associating the secondary electron image obtained from the secondary electron with a backscattered electron image for the same position as the position of the secondary electron image and extracts a contour from the secondary electron image by referencing the created dictionary for actual measurement. As a result, it is possible to appropriately extract the contour of the target object with high accuracy.

Example

An example will be described with reference to FIGS. 11A, 11B, and 12. FIGS. 11A and 11B are graphs illustrating positions of the contours extracted in an example and a comparative example.

The target contour includes both ends of a width direction of a metal line buried in an insulation layer. The contour of the example was extracted using a method similar to the method of the aforementioned embodiment. The contour of the comparative example was set as a peak in a first derivative of the luminance obtained from the secondary electron image.

The abscissa of the graph is a horizontal position (X) on a secondary electron image used to extract a contour. The ordinate of the graph is luminance or a first derivative of the luminance obtained from the secondary electron image. The dotted line of the graph indicates positions of the contours C(L) and C(R) extracted using the method of the example.

As illustrated in FIG. 11A, a slight difference was recognized between the position of the contour C(L) of the example and the contour C(L)' of the comparative example representing the left end of the metal line.

As illustrated in FIG. 11B, a significant difference was recognized between the position of the contour C(R) of the example and the contour C(R)' of the comparative example representing the right end of the metal line.

FIG. 12 is a diagram illustrating position accuracy of the contour extracted in the example and the comparative example.

In calculation of the position accuracy of the contour, a contour extracted from a backscattered electron image was set as a true value. In addition, the position accuracy of the contour was calculated on the basis of a deviation (pixel value) from the contour extracted from the backscattered electron image. The numerical values in FIG. 12 are obtained by averaging the data in a pair of the secondary electron image and the backscattered electron image 114.

As illustrated in FIG. 12, a deviation of the contour in the left end was 0.45 pixels in the example and 0.47 pixels in the comparative example. The example was slightly superior. A deviation of the contour in the right end was 0.41 pixels in the example and 0.54 pixels in the comparative example. The accuracy of the example was higher.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A contour extraction method for extracting a contour of a target object from an image obtained using an electron beam, comprising:

extracting the contour of the target object from a backscattered electron image;

creating a dictionary for associating a secondary electron image obtained from a portion common to the backscattered electron image with the contour;

calculating a likelihood of the contour of the target object in a plurality of positions of a newly obtained secondary electron image by referencing the dictionary regarding the newly obtained secondary electron image; and setting a route along which a total sum of the likelihood is maximized out of the plurality of positions as the contour of the target object.

2. The contour extraction method according to claim 1, further comprising performing iterative learning for the backscattered electron image and the secondary electron image obtained from a portion common to the backscattered electron image to extract a pattern representing a relationship between the contour extracted from the backscattered electron image and the secondary electron image, wherein, when the dictionary is created, the dictionary is created on the basis of the extracted pattern.

3. The contour extraction method according to claim 2, wherein, when the pattern is extracted, machine learning is used.

4. The contour extraction method according to claim 2, wherein, when the pattern is extracted, a statistical amount based on luminance extracted from the secondary electron image is used.

5. The contour extraction method according to claim 1, wherein, when the contour of the target object is extracted from the backscattered electron image, a position where a contrast between brightness and darkness is most remarkably changed is set as a position of the contour.

6. The contour extraction method according to claim 1, further comprising:

predicting a straight section and a curved section of the contour from data representing the contour of the target object; and determining the plurality of positions for calculating the likelihood so as to be arranged across the contour on the basis of the prediction.

7. The contour extraction method according to claim 1, wherein the target object is a boundary between objects formed of different materials, a hollow of the object, or a protrusion of the object.

8. The contour extraction method according to claim 1, wherein the target object is metal buried in an insulation layer.

9. A contour extraction device that extracts a contour of a target object from an image obtained using an electron beam, comprising:

a contour extraction unit that extracts the contour of the target object from a backscattered electron image;

a dictionary creating unit that creates a dictionary for associating a secondary electron image obtained from a portion common to the backscattered electron image with the contour; and a computation unit that calculates a likelihood of the contour of the target object in a plurality of positions of a newly obtained secondary electron image by referencing the dictionary regarding the newly obtained secondary electron image and sets a route along which a total sum of the likelihood is maximized out of the plurality of positions as the contour of the target object.

10. The contour extraction device according to claim 9, further comprising:

a pattern extraction unit that performs iterative learning for the backscattered electron image and the secondary electron image obtained from a portion common to the backscattered electron image to extract a pattern representing a relationship between the contour extracted from the backscattered electron image and the secondary electron image, wherein the dictionary creating unit creates the dictionary on the basis of the extracted pattern.

11. The contour extraction device according to claim 10, wherein the pattern extraction unit extracts the pattern using machine learning.

12. The contour extraction device according to claim 9, wherein the contour extraction unit extracts the contour of the target object using a statistical amount based on luminance extracted from the secondary electron image.

13. The contour extraction device according to claim 9, wherein the computation unit predicts a straight section and a curved section of the contour from data representing the contour of the target object and determines the plurality of positions for calculating the likelihood so as to be arranged across the contour on the basis of the prediction.

14. A computer-readable non-volatile recording medium storing a program that causes a computer to execute learning for extracting a contour of a target object from an image obtained using an electron beam, the program causing the computer to execute a processing comprising:

extracting the contour of the target object from a backscattered electron image;

creating a dictionary for associating a secondary electron image obtained from a portion common to the backscattered electron image with the contour.

15. The non-volatile recording medium according to claim 14, wherein the processing further comprising performing iterative learning for the backscattered electron image and the secondary electron image obtained from a portion common to the backscattered electron image to extract a pattern representing a relationship between the contour extracted from the backscattered electron image and the secondary electron image, wherein, in the processing for creating the dictionary, the dictionary is created on the basis of the extracted pattern.

16. The non-volatile recording medium according to claim 15, wherein, in the processing for extracting the pattern, machine learning is used.

17. The non-volatile recording medium according to claim 15, wherein, in the processing for extracting the pattern, a statistical amount based on luminance extracted from the secondary electron image is used.

18. The non-volatile recording medium according to claim 14, wherein, in the processing for extracting the contour of the target object from the backscattered electron image, a position where a contrast between brightness and darkness is most remarkably changed is set as a position of the contour.

19. The non-volatile recording medium according to claim 14, wherein the target object is a boundary between objects formed of different materials, a hollow of the object, or a protrusion of the object.

20. The non-volatile recording medium according to claim 14, wherein the target object is metal buried in an insulation layer.

* * * * *